(12) United States Patent
Zheng

(10) Patent No.: US 9,110,375 B2
(45) Date of Patent: Aug. 18, 2015

(54) MANUFACTURING METHOD OF MASK PLATE AND ARRAY SUBSTRATE

(71) Applicant: Shenzhen China Star Optoelectronics Technology Co., Ltd., Shenzhen, Guangdong (CN)

(72) Inventor: Hua Zheng, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 212 days.

(21) Appl. No.: 13/985,286

(22) PCT Filed: Jul. 1, 2013

(86) PCT No.: PCT/CN2013/078589
§ 371 (c)(1),
(2) Date: Aug. 13, 2013

(87) PCT Pub. No.: WO2014/201730
PCT Pub. Date: Dec. 24, 2014

(65) Prior Publication Data
US 2014/0377690 A1    Dec. 25, 2014

(30) Foreign Application Priority Data
Jun. 20, 2013  (CN) .......................... 2013 1 02480348

(51) Int. Cl.
*G03F 1/38* (2012.01)
*G03F 1/00* (2012.01)
*H01L 27/12* (2006.01)
*G03F 7/00* (2006.01)

(52) U.S. Cl.
CPC ... *G03F 1/38* (2013.01); *G03F 1/00* (2013.01); *G03F 7/0007* (2013.01); *H01L 27/1288* (2013.01)

(58) Field of Classification Search
CPC ...... G03F 1/38; G03F 7/0007; H01L 27/1288
USPC ............................................................. 430/5
See application file for complete search history.

(56) References Cited

U.S. PATENT DOCUMENTS

| | | | |
|---|---|---|---|
| 2009/0146565 A1* | 6/2009 | Hong | 313/582 |
| 2010/0255409 A1* | 10/2010 | Kang et al. | 430/5 |
| 2012/0206684 A1* | 8/2012 | Lee et al. | 349/139 |
| 2014/0103480 A1* | 4/2014 | Lin et al. | 257/466 |

* cited by examiner

*Primary Examiner* — Stewart Fraser
(74) *Attorney, Agent, or Firm* — Andrew C. Cheng

(57) ABSTRACT

A manufacturing method of a mask plate and an array substrate is provided. The mask plate is for manufacturing fanout leads in a non-effective display area on an array substrate. The mask plate includes a fanout lead pattern having a plurality of fanout impression lines, wherein each fanout impression line has a predetermined line width, and each of some of the fanout impression lines has at least one curve portion, wherein for one fanout impression line, a line width of the at least one curve portion is smaller than the predetermined line width of the fanout impression line. A manufacturing method of an array substrate utilizes the foregoing mask plate to manufacture the array substrate.

18 Claims, 4 Drawing Sheets

(a)   (b)

(a)    (b)

MANUFACTURING METHOD OF MASK PLATE AND ARRAY SUBSTRATE

BACKGROUND OF THE INVENTION

1. Field of the Invention

The present invention relates to display manufacturing field, more particular to a manufacturing method of a mask plate and an array substrate.

2. Description of Related Art

The display panel for manufacturing the display includes the LCD (Liquid Crystal Display) panel and the OLED (Organic Light-Emitting Diode) panel. They are all required the photolithography process to formed the circuit.

The photolithography process mainly includes photoresist four steps of photoresist coating, exposure, development and etching. After forming a metal layer on a glass substrate, it start to coat the photoresist, and a photoresist layer is formed on the metal layer; then, exposing the photoresist layer; after developing the exposed photoresist layer, the photoresist layer forms a pre-designed circuit pattern; finally, etching the metal layer, wherein, the metal without the protection of the photoresist is etched away, and the remaining metal forms the circuit.

It is well known that the display panel includes the effective display area (AA, Active Area) and the non-effective display area surrounded the effective display area. In the effective display area, it includes various signal lines such as the scanning lines and the data lines. The non-effective area includes fanout leads, wherein, one end of each fanout lead connects to the signal line, and the other end of each fanout lead connects to peripheral driver chip. With reference to FIG. 1, which is schematic view illustrating a display panel of the prior art, and it also enlarges the fanout leads. Because the fanout leads connected to the signal lines correspondingly, when they transmit signals, the fanout leads function as the load of the signals. If the fanout leads are all straight lines, the effective lengths of the outer periphery fanout leads are greater than the effective lengths of the middle portion of the fanout leads such that the resistances of the outer periphery fanout leads are greater than the resistances of the middle portion of the fanout leads. Therefore, the different signal lines will have different loads so as to impact the signal transmission, which results in image display unevenness of the display. This phenomenon is called the display unevenness (Fallout Mura) phenomenon. To overcome this problem, the middle portions of the fanout leads are curved to increase the effective lengths of the middle portion of the fanout leads, which could reduce the difference in resistances with the outer periphery fanout leads.

However, when using the photolithography process of the prior art, due to the limited capacity of the process, the curve portion of the fanout lead is often difficult to achieve predesigned line width, which results in further increasing the difference in resistances. With, reference to FIG. 2, which is a comparison drawing of a fanout lead on the display panel formed before and after by the conventional art. Part (a) of FIG. 2 shows a desired shape of a curve portion of the fanout lead before forming. The line width of the curve portion is equal to the line width of the other portion. Part (b) of FIG. 2 shows an actual shape of the curve portion of the fanout lead after the formation available by the current photolithography process. The line width of the curve portion is greater than the line width of the other portion.

The reasons for this result are: In the exposure step, the light path is difficult to achieve perfectly collimated, there is a small amount of lateral light. The exposure area will be irradiated by collimated light and the lateral light at the same time. For the part (b) of FIG. 2, the A area of the fanout lead is not irradiated by the light, the A area is surrounded by three sides, that is, the A area is not exposed by the lateral light at the three sides, but the other area can he irradiated with the collimated light and lateral light. Therefore, the photosensitive intensity of the A area is weaker than other exposed areas, and the chemical reaction of the photoresist is slower such that when developing and etching in the subsequent steps, the developing rate and the etching rate of the A area is slower than other exposed areas. Finally, the curve portion of the fanout lead adds the A area so that the line width of the curve portion of the fanout lead is increased, and the resistance is correspondingly smaller such that the difference in resistances becomes larger.

SUMMARY OF THE INVENTION

The main object of the present invention is to provide a manufacturing method of a mask plate and an array substrate so as to reduce the difference in resistance levels between fanout leads.

The technical problem solved by the present invention is to provide a mask plate for manufacturing fanout leads in a non-effective display area on an array substrate, comprising: a fanout lead pattern having a plurality of fanout impression lines, wherein an effective length of each fanout impression line is equal, and each fanout impression line has a predetermined line width, and each of some of the fanout impression lines has at least one curve portion, wherein for one fanout impression line having two or more curve portions, the multiple curve portions are S-shaped and arrange continuously, and for one fanout impression line, a line width of the at least one curve portion is smaller than the predetermined line width of the fanout impression line.

Wherein, the predetermined line width of each fanout impression line is equal.

Wherein, the predetermined line widths at a middle portion of the fanout impression lines are smaller than the predetermined line widths at an edge portion of the fanout impression lines.

Wherein, the predetermined line widths of the fanout impression lines are increased gradually from the middle portion to the edge portion.

In order to solve the above-mentioned technical problem, another technical solution provided by the present invention is a mask plate for manufacturing fanout leads in a non-effective display area on an array substrate, comprising: a fanout lead pattern having a plurality of fanout impression lines, wherein each fanout impression line has a predetermined line width, and each of some of the fanout impression lines has at least one curve portion, wherein for one fanout impression line, a line width of the at least one curve portion is smaller than the predetermined line width of the fanout impression line.

Wherein, for one fanout impression line having two or more curve portions, the multiple curve portions are S-shaped and arranged continuously.

Wherein, the predetermined line width of each fanout impression line is equal.

Wherein, the predetermined line widths at a middle portion of the fanout impression lines are smaller than the predetermined line widths at an edge portion of the fanout impression lines.

Wherein, the predetermined line widths of the fanout impression lines are increased gradually from the middle portion to the edge portion.

Wherein, an effective length of each fanout impression line is equal.

In order to solve the above-mentioned technical problem, another technical solution provided by the present invention is a manufacturing method for an array substrate comprises:

providing a glass substrate, and sequentially forming a metal layer and a photoresist layer on the glass substrate;

providing a mask plate, and using the mask plate to expose the glass substrate, wherein the exposure rate of a position of the photoresist layer corresponding to a curve portion is less than the exposure rate of the other position of the photoresist layer, wherein the mask plate includes a fanout lead pattern having a plurality of fanout impression lines, wherein each fanout impression line has a predetermined line width, and each of some of the fanout impression lines has at least one curve portion, wherein for one fanout impression line, a line width of the at least one curve portion is smaller than the predetermined line width of the fanout impression line;

developing the glass substrate, and transfer printing the fanout lead pattern on the photoresist layer, wherein the developing rate of the position of the photoresist layer corresponding to the curve portion is less than the developing rate of the other position; and etching the metal layer to form the fanout leads on the glass substrate, wherein the etching rate of a position of the metal layer corresponding to the curve portion is less than the etching rate at the other position, so that the width line of the fanout lead corresponding to the curve portion is less than or equal to the predetermined line width.

Wherein, the photoresist layer is made of a positive photoresist, and the fanout lead pattern is a non-hollow pattern,.

Wherein, the photoresist layer is made of a negative photoresist. and the fanout lead pattern is a hollow pattern.

Wherein, for one fanout impression. line having two or more curve portions, the multiple curve portions are S-shaped and arranged continuously.

Wherein, the .predetermined line .width of each fanout impression line is equal.

Wherein, the predetermined line widths at a middle portion of the fanout impression lines are smaller than the predetermined, line widths at an edge portion of the fanout impression lines.

Wherein, the predetermined line widths of the fanout impression lines are increased gradually from the middle portion to the edge portion.

Wherein, an effective length of each fanout impression line is equal. In summary, in the manufacturing method of a mask plate and an array substrate of the present invention, the line width of the curve portion of the fanout impress line is smaller than the predetermined line width of the curve portion of the fanout impress line. The photosensitive intensity of the photoresist layer at the position of the curve portion is weaker than the photosensitive intensity of the photoresist layer at the other position. of the curve portion. After developing and etching, the line width of the fanout lead corresponding to the curve portion is smaller than or equal to the predetermined line width so as to reduce the difference in resistance levels between the fanout leads, and eliminate the display uneven. phenomenon.

DETAILED DESCRIPTION OF THE PREFERRED EMBODIMENT

The following content combines with the drawings and the embodiment for describing the present invention in detail.

Figure 1:
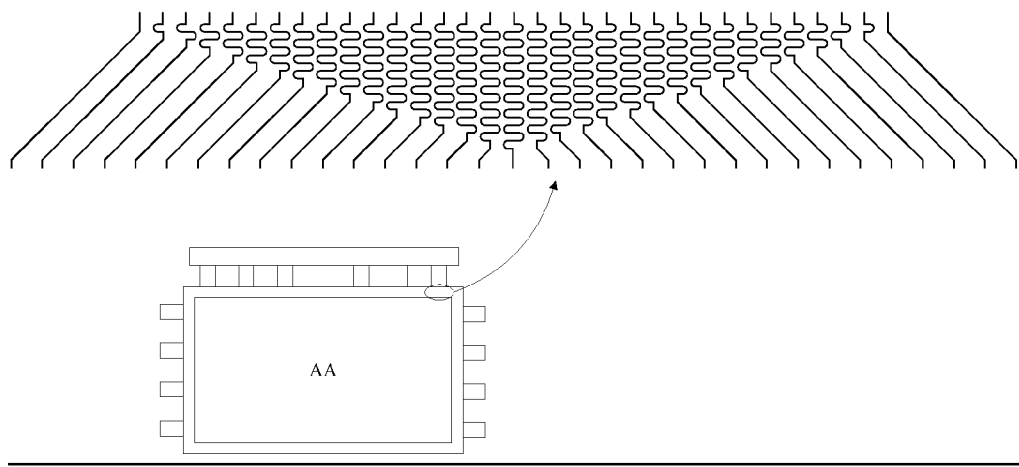
FIG. 1 is a schematic view of a display panel in the conventional art, and it also enlarged fanout leads.
Figure 2:
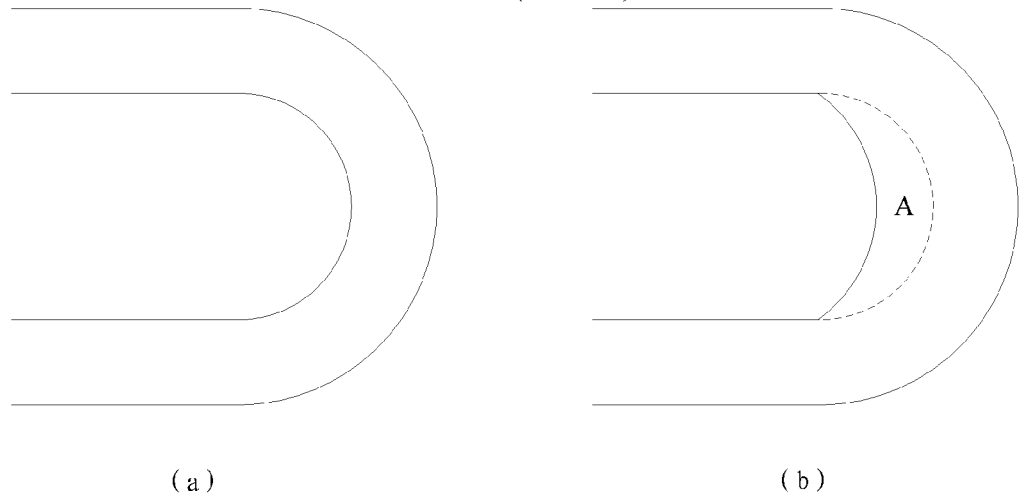
FIG. 2 a comparison drawing of a fanout lead on the display panel formed before and after by the conventional art.
Figure 3:
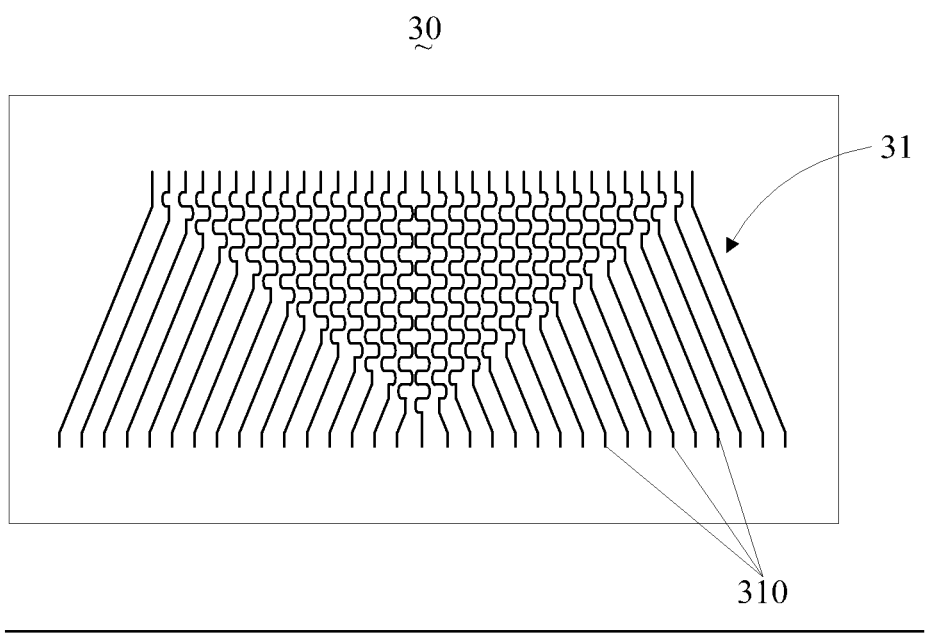
FIG. 3 is a schematic drawing of a mask plate according to an embodiment of the present invention.
Figure 4:
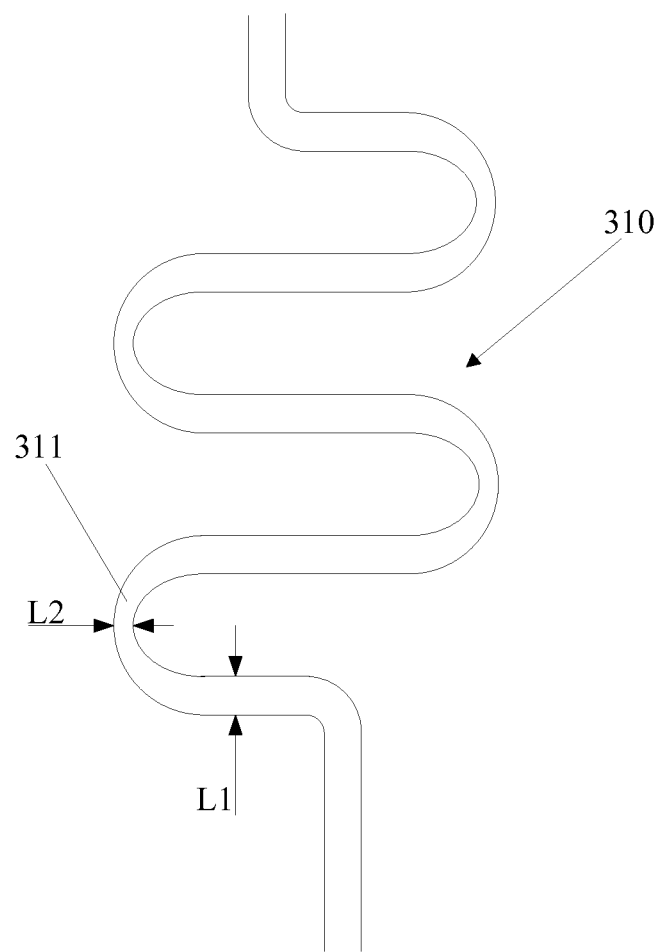
FIG. 4 is an enlarge view illustrating one fanout impression line of the mask plate shown in FIG. 3.

Please refer to FIG. 3 and FIG. 4 together. FIG. 3 is a schematic drawing of a mask plate according to an embodiment of the present invention. FIG. 4 is an enlarge view illustrating one fanout impression line of the mask plate shown in FIG. 3.

A mask plate 30 is for manufacturing fanout leads in a non-effective display area on an array substrate. The mask plate 30 includes a fanout lead pattern 31, and the fanout lead pattern 31 corresponds to the fanout leads in the non-effective display area, that is, using the mask plate 30 to expose, the fanout lead pattern 31 can transfer into a pattern of the fanout leads on the array substrate. The fanout lead pattern 31 is a fan shape, and the fanout leads formed by the fanout lead pattern 31 will also distributed as the fan shape.

The fanout lead pattern 31 has a plurality of fanout impression lines 310. Each fanout impression line 310 has a predetermined width L1, and the predetermined width L1 is consistent with the line width met a design value. Some of the fanout impression lines 310 have curve portions 311. Because the fanout impression lines 310 correspond to the fanout leads, the lengths of the fanout impression lines 310 determine the lengths of the fanout leads. If the effective lengths of the fanout impression lines 310 are not the same, the effective lengths of the fanout leads are also not the same. Therefore, a difference in resistance values between the fanout leads will increase. The curve portions 311 may increase the effective lengths of the fanout impression lines 310. In the present embodiment, the fanout impression lines 310 have equal effective lengths.

For one fanout impression line, a line width L2 of the curve portion 311 of the fanout impression line 310 is smaller than the predetermined width L1 of the fanout impression line 310. For the fanout impression lines 310 without the curve portion 311, the line widths at every positions are all the predetermined width L1, For the fanout impression line 310 having two or more curve portions 311, the multiple curve portions 311 are S-shaped and arrange continuously (as shown in FIG. 4).

The predetermined width L1 of each fanout impression line 310 could be the same or different. In this embodiment, the predetermined line width L1 of each fanout impression line 310 is the same. In another embodiment, the predetermined line widths L1 at a middle portion of the fanout impression lines 310 of the fanout lead pattern 31 is smaller than the predetermined line widths L1 at an edge portion of the fanout impression lines 310 of the fanout lead pattern 31. In particular, the predetermined line widths L1 of the plurality of fanout impression lines 310 are increased gradually from the middle portion to the edge portion.

When the effective lengths at the middle portion of the fanout impression lines 310 of the fanout lead pattern 31 is smaller than the effective lengths at the edge portion of the fanout impression lines 310 of the fanout lead pattern 31, if the predetermined line width sL1 at the middle portion of the fanout impression lines 310 of the fanout lead pattern 31 is smaller than the predetermined line widths L1 at the edge portion of the fanout impression lines 310 of the fanout lead pattern 31, it forms that the resistances in unit length at the middle portion of the fanout leads are greater than the resistances in unit length at the edge portion of the fanout leads, which can be reduced resistance the difference in resistances levels between the fanout leads.

Figure 5:
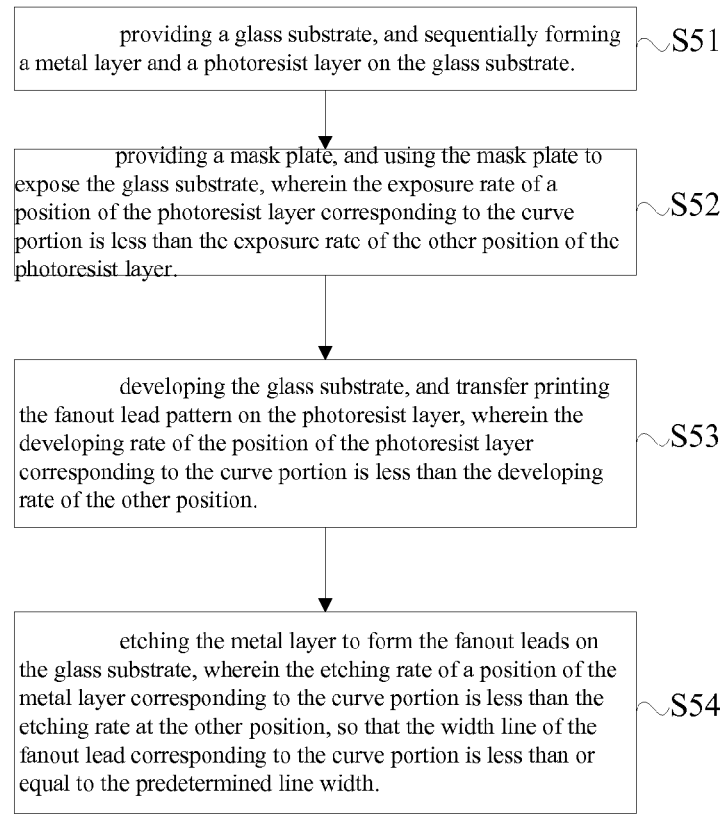
FIG. 5 is a flow chart illustrating a manufacturing method of an array substrate according to an embodiment of the present invention.

With, reference to FIG. 5, it is a flow chart illustrating a manufacturing method of an array substrate according to an embodiment of the present invention. The manufacturing method comprises the following steps:

Step S51: providing a glass substrate, and sequentially forming a metal layer and a photoresist layer on the glass substrate.

Wherein the metal layer may be formed by using the deposition process, and the photoresist layer may be formed by the coating process.

Step S52: providing a mask plate, and using the mask plate to expose the glass substrate, wherein the exposure rate of a position of the photoresist layer corresponding to the curve portion 311 is less than the exposure rate of other position of the photoresist layer.

Wherein the mask plate is the mask plate 30 described at the foregoing embodiment. In the present embodiment, the photoresist layer is made of the positive photoresist. The fanout lead pattern 31 is a non-hollow pattern. That is, the photoresist which forms the fanout leads does not require being irradiated.

Because the line width L2 at the curve portion 311 of the fanout impression line 310 is smaller than the predetermined line width L1, the photoresist layer corresponding to the curve portion 311 has a weaker photosensitive intensity, so that the chemical reaction of the photoresist at the inner portion, of the curve portion 311 is weaker. For example, please also refer to FIG. 6, which is comparison drawing of the photoresist layer on the glass substrate in the exposing and developing step according the manufacturing method shown in FIG. 5.

Figure 6:
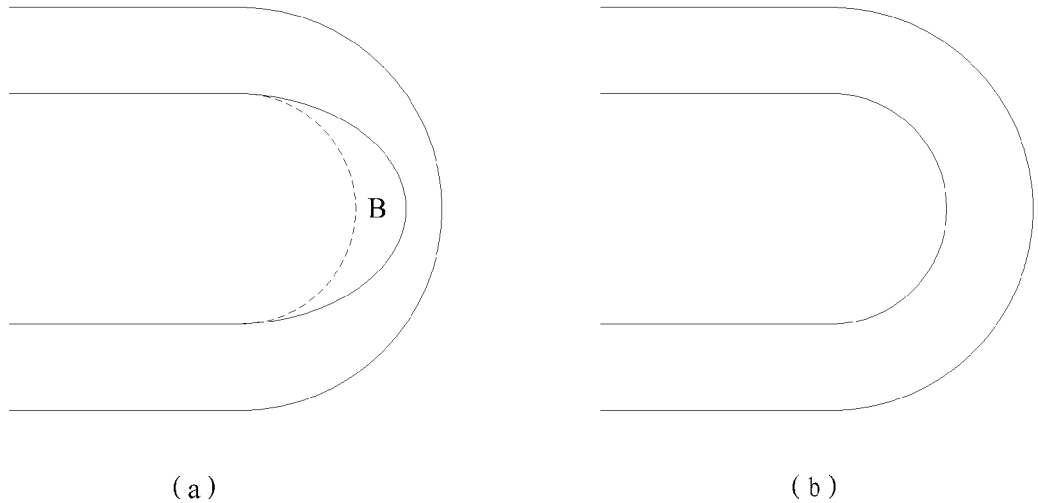
FIG. 6 is comparison drawing of the photoresist layer on the glass substrate in the exposing and developing step according the manufacturing method in FIG. 5.

The part (a) of FIG. 6 is schematic drawing of the photoresist layer under the exposure step. After exposing through the mask plate 30, the position of the photoresist layer corresponding to the curve portion 311, i.e., the B area, cannot be irradiated by the lateral light due to surrounded by the photoresist at three sides. The photosensitive intensity is weaker so that the chemical reaction of the photoresist at the B area is slower. Therefore, the exposure rate of the B area is slower than the other position.

Step S53: developing the glass substrate, and transfer printing the fanout lead pattern on the photoresist layer, wherein the developing rate of the position of the photoresist layer corresponding to the curve portion 311 is less than the developing rate of the other position.

Wherein, the photoresist after development process is shown as the part (b) of FIG. 6. The part (b) of FIG. 6 is schematic drawing of the photoresist layer under the development step. Because the chemical reaction of the photoresist at the B area is very slow, the chemical property of the photoresist basically does not change. In the development process, the development rate is very slow, and the photoresist will not be washed by the developer. The photoresist at the B area is preserved so that the line width of the photoresist corresponding to the curve portion 311 is increased as shown at the part (b) of FIG. 6.

Step S54: Etching the metal layer to form the fanout leads on the glass substrate, wherein the etching rate of a position of the metal layer corresponding to the curve portion 311 is less than the etching rate at the other position, so that the width line of the fanout lead corresponding to the curve portion 311 is less than or equal to the predetermined line width.

Wherein, the photoresist pattern remaining on the metal layer is the same with the fanout lead pattern 31. In the etching process, the etching rate of the metal layer protected the B area is very slow. Therefore, the remaining metal pattern is the same with the fanout lead pattern 31, and the line width of the fanout leads corresponding to the curve portion 311 is less than or equal to the predetermined width Li such that the difference in resistance levels between the fanout leads will be reduced so as to eliminate the uneven display phenomenon.

In another embodiment, the photoresist layer may be made of the negative photoresist, and the fanout lead pattern 31 is a hollow pattern. Whether the photoresist is positive or negative, the photoresist at the B area will be retained such that the line width at every positions of the fanout leads on the substrate are equal. and even, the line width of the fanout lead corresponding to the curve portion 311 is less than the predetermined line width.

Through the foregoing way, in the manufacturing method of a mask plate and an array substrate of the present invention, the line width of the curve portion of the fanout impress line is smaller than the predetermined line width of the curve portion of the fanout impress line. The photosensitive intensity of the photoresist layer at the position of the curve portion is weaker than the photosensitive intensity of the photoresist layer at the other position of the curve portion. After developing and etching, the line width of the fanout lead corresponding to the curve portion is smaller than or equal to the predetermined line width so as to reduce the difference in resistance levels between the fanout leads, and eliminate the display uneven phenomenon.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A mask plate for manufacturing fanout leads in a non-effective display area on an array substrate, comprising:
a fanout lead pattern having a plurality of fanout impression lines, wherein an effective length of each fanout impression line is equal, and each fanout impression line has a predetermined line width, and some of the fanout impression lines have at least one curve portion, wherein for one fanout impression line having two or more curve portions, the multiple curve portions are S-shaped and arranged continuously, and for the one fanout impression line, a line width of the at least one curve portion is smaller than the predetermined line width of the one fanout impression line.

2. The mask plate according to claim 1, wherein, the predetermined line width of each fanout impression line is equal.

3. The mask plate according to claim 1, wherein, the predetermined line widths at a middle portion of the fanout impression lines are smaller than the predetermined line widths at an edge portion of the fanout impression lines.

4. The mask plate of claim 3, wherein, the predetermined line widths of the fanout impression lines are increased gradually from the middle portion to the edge portion.

5. A mask plate for manufacturing fanout leads in a non-effective display area on an array substrate, comprising:
a fanout lead pattern having a plurality of fanout impression lines, wherein each fanout impression line has a predetermined line width, and some of the fanout impression lines have at least one curve portion, wherein for one fanout impression line, a line width of the at least one curve portion is smaller that the predetermined line width of the one fanout impression line.

6. The mask plate according to claim 5, wherein, for one fanout impression line having two or more curve portions, the multiple curve portions are S-shaped and arranged continuously.

7. The mask plate according to claim 5, wherein, the predetermined line width of each fanout impression line is equal.

8. The mask plate according to claim 5, wherein, the predetermined line widths at a middle portion of the fanout impression lines are smaller than the predetermined line widths at an edge portion of the fanout impression lines.

9. The mask plate of claim 8, wherein, the predetermined line widths of the fanout impression lines are increased gradually from the middle portion to the edge portion.

10. The mask plate according to claim 5, wherein, an effective length of each fanout impression line is equal.

11. A manufacturing method for an array substrate comprises:
providing a glass substrate, and sequentially forming a metal layer and a photoresist layer on the glass substrate;
providing a mask plate, and using the mask plate to expose the glass substrate, wherein the exposure rate of a position of the photoresist layer corresponding to a curve portion is less than the exposure rate of a different position of the photoresist layer, wherein the mask plate includes a fanout lead pattern having a plurality of fanout impression lines, wherein each fanout impression line has a predetermined line width, and some of the fanout impression lines have at least one curve portion, wherein for one fanout impression line, a line width of the at least one curve portion is smaller than the predetermined line width of the one fanout impression line;
developing the glass substrate, and transfer printing the fanout lead pattern on the photoresist layer, wherein the developing rate of the position of the photoresist layer corresponding to a curve portion is less than the exposure rate of the different position; and
etching the metal layer to form fanout leads on the glass substrate, wherein the etching rate of a position of the metal layer corresponding to the curve portion is less than the etching rate at a different position of the metal layer, so that the line width of the fanout lead corresponding to the curve portion is less than or equal to the predetermined line width.

12. The manufacturing method according to claim 11, wherein, the photoresist layer is made of a positive photoresist, and the fanout lead pattern is a non-hollow pattern.

13. The manufacturing method according, to claim 11, wherein, the photoresist layer s made of a negative photoresist, and the fanout lead pattern is a hollow pattern.

14. The manufacturing method according to claim 11, wherein for one fanout impression line having two or more curve portions, the multiple curve portions are S-shaped and arranged continuously.

15. The manufacturing method according to claim 11, wherein, the predetermined line width of each fanout impression line is equal.

16. The manufacturing method according to claim 11, wherein, the predetermined line widths at a middle portion of the fanout impression lines are smaller than the predetermined line widths at an edge portion of the fanout impression lines.

17. The manufacturing method according to claim 16, wherein, the predetermined line widths of the fanout impression lines are increased gradually from the middle portion to the edge portion.

18. The manufacturing method according to claim 11, wherein, an effective length of each fanout impression line is equal.

* * * * *